(12) United States Patent
Lu et al.

(10) Patent No.: US 7,758,964 B2
(45) Date of Patent: Jul. 20, 2010

(54) FLAME RESISTANT COVERCOAT FOR FLEXIBLE CIRCUIT

(75) Inventors: David D. Lu, Austin, TX (US); Eumi Pyun, Austin, TX (US)

(73) Assignee: 3M Innovative Properties Company, St. Paul, MN (US)

(*) Notice: Subject to any disclaimer, the term of this patent is extended or adjusted under 35 U.S.C. 154(b) by 1086 days.

(21) Appl. No.: 11/352,125

(22) Filed: Feb. 10, 2006

(65) Prior Publication Data

US 2007/0190337 A1    Aug. 16, 2007

(51) Int. Cl.
    B32B 27/40    (2006.01)
    C08K 5/53    (2006.01)

(52) U.S. Cl. .................... 428/423.1; 524/126

(58) Field of Classification Search .............. 428/423.1; 524/126
    See application file for complete search history.

(56) References Cited

U.S. PATENT DOCUMENTS

| | | | |
|---|---|---|---|
| 4,165,411 A | 8/1979 | Marans et al. | |
| 5,110,840 A | 5/1992 | Blount | |
| 5,424,094 A * | 6/1995 | Tsunoda et al. | 427/128 |
| 5,510,140 A * | 4/1996 | Kurose et al. | 427/131 |
| 5,942,561 A | 8/1999 | Okisaki et al. | |
| 6,124,394 A | 9/2000 | Goto et al. | |
| 6,303,674 B1 | 10/2001 | Kleiner | |
| 6,365,071 B1 | 4/2002 | Jenewein et al. | |
| 6,384,128 B1 | 5/2002 | Wadahara et al. | |
| 6,420,459 B1 | 7/2002 | Hrold | |
| 6,794,039 B2 | 9/2004 | Huusken | |
| 6,955,848 B2 * | 10/2005 | Wakizaka et al. | 428/209 |
| 6,982,049 B1 | 1/2006 | Mabey et al. | |
| 7,205,346 B2 | 4/2007 | Harashina | |
| 7,208,539 B2 | 4/2007 | Tsuchikawa et al. | |
| 7,332,229 B2 * | 2/2008 | Uchida et al. | 428/472.3 |
| 7,618,766 B2 * | 11/2009 | Mutoh | 430/281.1 |
| 2002/0010237 A1 | 1/2002 | Heinen et al. | |
| 2003/0018107 A1 | 1/2003 | Heinen et al. | |
| 2003/0146421 A1 | 8/2003 | Wakizaka et al. | |
| 2004/0021135 A1 | 2/2004 | Steenbakkers-Menting et al. | |
| 2004/0051087 A1 | 3/2004 | Thewes et al. | |
| 2004/0227130 A1 | 11/2004 | Hoerold et al. | |
| 2005/0014875 A1 | 1/2005 | Knop et al. | |
| 2005/0031822 A1 * | 2/2005 | Aihara et al. | 428/40.1 |
| 2005/0101708 A1 | 5/2005 | Knop et al. | |

(Continued)

FOREIGN PATENT DOCUMENTS

EP    1580320    9/2005

(Continued)

OTHER PUBLICATIONS

"UL Standard for Safety for Test for Flammability of Plastic Materials for Parts in Devices and Appliances" Underwriters Laboratories Inc. (UL) 2001, pp. 1-2, tr3, 14-18 (section 8—Jun. 2000 revision).

(Continued)

*Primary Examiner*—Thao T. Tran
(74) *Attorney, Agent, or Firm*—Melanie G. Gover

(57) ABSTRACT

A flame-resistant electrical circuit covercoat composition includes a phosphinate and a urethane solder mask. The composition can be used as a covercoat for flexible circuits.

10 Claims, 1 Drawing Sheet

U.S. PATENT DOCUMENTS

| | | |
|---|---|---|
| 2005/0143503 A1 | 6/2005 | Bauer et al. |
| 2006/0041042 A1 | 2/2006 | Thewes et al. |
| 2006/0110599 A1 | 5/2006 | Honma et al. |
| 2006/0167143 A1 | 7/2006 | Borade et al. |
| 2006/0167144 A1 | 7/2006 | Borade et al. |
| 2006/0234045 A1 | 10/2006 | Nakanishi et al. |
| 2006/0252890 A1 | 11/2006 | Romenesko et al. |
| 2006/0264538 A1 | 11/2006 | Nakanishi et al. |
| 2007/0116964 A1 | 5/2007 | Guo et al. |
| 2007/0259582 A1 | 11/2007 | Kohei |
| 2007/0282027 A1 | 12/2007 | Fujimoto et al. |
| 2008/0166484 A1 | 7/2008 | Smith |
| 2008/0241452 A1 | 10/2008 | Kondo et al. |
| 2008/0241529 A1 | 10/2008 | Bauer et al. |
| 2009/0008138 A1 | 1/2009 | Uchida et al. |
| 2009/0104444 A1 | 4/2009 | Garcia-Ramirez et al. |
| 2009/0124734 A1 | 5/2009 | Pyun et al. |

FOREIGN PATENT DOCUMENTS

| | | |
|---|---|---|
| GB | 1105953 | 3/1968 |
| JP | 10-017796 | 1/1998 |
| JP | 2002284963 A | 10/2002 |
| JP | 2006-193584 | 7/2006 |
| JP | 2007-051212 | 3/2007 |
| JP | 2007-302762 | 11/2007 |
| KR | 2004035124 | 4/2004 |
| WO | WO 99/43390 | 9/1999 |
| WO | WO 2006/121549 | 11/2006 |
| WO | WO 2007/011099 | 1/2007 |

OTHER PUBLICATIONS

Pyun et al., "Composition, Method Of Making The Same, And Use Therefor", U.S. Appl. No. 61/103,288, filed Oct. 7, 2008.

Pyun et al., "Composition, Method Of Making The Same, And Use Therefor", U.S. Appl. No. 12/573,197, filed Oct. 5, 2009.

* cited by examiner

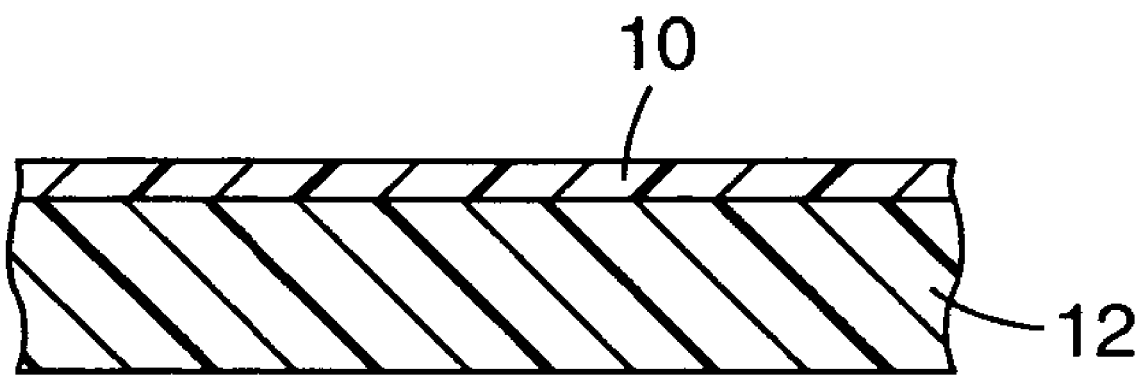

FLAME RESISTANT COVERCOAT FOR FLEXIBLE CIRCUIT

FIELD

The present disclosure generally relates to the field of flame-resistant covercoats. In particular, the disclosure relates to flame-resistant covercoats for flexible circuits.

BACKGROUND

Flexible circuits are widely used in the area of consumer electronics due to the substantial reduction in the thickness and size of the resulting product. In particular, flexible circuits are currently being used in the construction of disc drives and flat panel displays for consumer products such as television monitors, computer monitors, and mobile telephone monitors. As electronic technology continues to progress, consumers are increasingly interested in thinner and more compact electrical products. The use of flexible circuits in the construction of television, computer, and phone monitors allows the thickness and weight of the panels to be substantially reduced, providing a more compact product.

When electrical components are used in consumer electronics, care must be taken to prevent the product from igniting or shorting. Thus, to ensure consumer safety, the electrical components of all consumer electronics must pass Underwriters Laboratories (UL) registration, which provides fire protection testing and approval procedures. Additionally, to prevent fires and shorting of electrical components, flexible circuits should maintain their electrical resistance in relatively harsh environments, such as an 85% relative humidity and 85 degrees Celsius (° C.) environment. To meet these requirements, flexible circuits are typically covered with a protective covercoat to protect the flexible circuit from the external elements of the environment. The covercoat on the flexible circuit is desirably flame-resistant and moisture impervious, providing protection to the flexible circuit when exposed to a high humidity or high temperature environment. This protects against the electrical components of the product either igniting or shorting.

While some existing current covercoat compositions are capable of passing flame-resistance tests, most are not capable of passing electrical bias tests at high humidity and high temperatures. This is due to the fact that the covercoats tend to absorb moisture from the environment, causing the electrical resistance to break down over time. An example of a current covercoat composition being used is an epoxy-based covercoat. Epoxy-based covercoats are typically not capable of passing flame-resistance tests without the use of a halogen, such as a brominated flame retardant, and are typically not capable of passing electrical resistance tests at all, and therefore cannot be used to protect flexible circuits in consumer electronics. Additionally, current covercoat compositions typically include at least one chemical halogen, which can be environmentally unfriendly.

BRIEF SUMMARY

One embodiment of the present invention is a composition for a flame-resistant electrical circuit covercoat including a phosphinate and a urethane solder mask.

In another embodiment of the present invention, a flexible circuit includes a substrate and a flame-resistant covercoat comprising a mixture of a urethane and a phosphinate.

In yet another embodiment of the present invention, a method of forming a flexible circuit with a flame-resistant covercoat includes (1) mixing a phosphinate and a urethane solder mask to form a composition for the covercoat, (2) coating the composition on the flexible circuit, and (3) curing the coated flexible circuit.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWING

The sole FIGURE is a cross-sectional view of a covercoat derived from the composition of the present invention on a flexible circuit.

While the FIGURE sets forth an embodiment of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The FIGURE may not be drawn to scale.

DETAILED DESCRIPTION

The sole FIGURE is a cross-sectional view of covercoat 10 of the present invention in use with exemplary flexible circuit 12. Covercoat 10 comprises a single or multi-layer phosphinate composition that is flame-resistant and maintains electrical bias in harsh environments for an extended period of time. The high flame and electrical resistance properties of covercoat 10 make covercoat 10 and flexible circuit 12 durable and capable of withstanding high humidity and high temperatures. Another advantage of covercoat 10 is that the thickness of the coating on flexible circuit 12 is decreased. Additionally, the composition can also be easily applied to flexible circuit 12 by conventional coating methods. The resulting flexible circuit 12 thus maintains electrical-resistance and flame-resistance needed in the construction of consumer electronics, improving the durability of flexible circuit 12 that covercoat 10 is protecting. These characteristics make the composition of covercoat 10 particularly desirable for protecting flexible circuits when constructing electrical components of consumer electronics. While covercoat 10 is discussed in reference to coating a flexible circuit, covercoat 10 can coat any electrical component in which flame-resistance and electrical-resistance in high temperature and high humidity environments are desired characteristics.

The composition of covercoat 10 includes a phosphinate and a urethane solder mask. All concentrations herein are expressed in weight percent, unless otherwise stated. Suitable component concentrations are in the composition range from about 10% to about 30% phosphinate and about 70% to about 90% urethane solder mask, based on the total compositional weight of the composition. Particularly suitable component concentrations are in the composition range from about 15% to about 25% phosphinate and 75% to about 85% urethane solder mask, based on the total compositional weight of the composition. Those skilled in the art will appreciate suitable component concentration ranges for obtaining comparable physical properties of the manufactured articles.

The phosphinate is represented by:

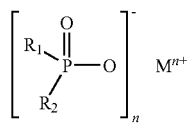

Where $R_1$ and $R_2$ are the same or different and are each $C_1$-$C_6$ alkyl, linear or branched, and/or aryl groups; M is Mg, Ca, Al, Sb, Sn, Ge, Ti, Zn, Fe, Zr, Ce, Bi, Sr, Mn, Li, Na, and/or K; and n is from 1 to 4.

Examples of suitable phosphinates include halogen-free organic phosphinates. Commercially available examples of suitable phosphinates include, but are not limited to those available under the trade designations EXOLIT OP 930, EXOLIT 935, and EXOLIT OP 1230, from Clariant Corporation, Charlotte, N.C. An example composition of a suitable phosphinate includes a polyol mixture, polypropylene glycol, polyisocyanate, and phosphinate.

Examples of suitable commercially available urethane solder masks include, but are not limited to those available under the trade designation AR7100 Solder Mask, from Ajinomoto Fine Technology Company, Incorporated, Kawasaki-Shi, Japan and Thermal Curable Solder Mask TF-200 TR6368/MK-20S, from Taiyo Ink Manufacturing Company, Limited, Tokyo, Japan.

The composition of covercoat 10 may also include additional materials in varying concentrations as individual needs may require. For example, the composition may further include pigments, hardeners, flow-promoting agents, viscosity modifiers, and combinations thereof.

The composition of covercoat 10 is flame-resistant while also maintaining electrical resistance. The flame-resistance of the composition is measured pursuant to a flammability test provided below in the Examples section of the specification. An example of the flame-resistance of a sample coated with the composition of the present invention is that the sample did not continue to burn for a significant amount of time after the sample was exposed to a flame for ten seconds. The sample was later exposed to the flame again for another ten seconds, and also did not continue to burn for a significant amount of time. Additionally, the sample did not burn to a clamp holding the sample, or ignite cotton positioned beneath the sample. Because covercoat 10 is flame-resistant, flexible circuit 12 coated with the composition resists ignition and burning. Flexible circuit 12 coated with the composition is thus capable of withstanding high temperatures.

The composition of covercoat 10 also maintains electrical resistance in harsh environments for an extended period of time. This is accomplished by using phosphinate in the composition of covercoat 10. The phosphinate maintains the electrical resistance of covercoat 10 in harsh environments when compared to currently used covercoats. The electrical resistance of the composition allows a flexible circuit coated with the composition to be exposed to high temperatures and high humidity without damaging the flexible circuit. The electrical resistance of the composition of covercoat 10 is measured pursuant to an electrical bias test provided below in the Examples section of the specification. A resistance equal to or higher than approximately 1E+9 ohms is an example of good electrical resistance of the composition. The electrical resistance of covercoat 10 increases the durability of flexible circuit 12 coated with covercoat 10. Because the composition maintains electrical resistance when exposed to high humidity and high temperatures, flexible circuit 12 protected by covercoat 10 can withstand harsh environments for an extended period of time.

Covercoat 10 may be made using a mixing and coating process. A sample of covercoat 10 is prepared by adding phosphinate into a urethane solder mask at a ratio of between approximately 10% to approximately 20% by solid weight of the solder mask. The mixture is well mixed. After mixing, the composition is applied to flexible circuit 12 to obtain a final film thickness of between approximately 20 microns and approximately 40 microns when dry. The final film thickness is preferably between approximately 25 microns and approximately 35 microns when dry. The coated material is then cured in an oven at between approximately 100° C. and approximately 200° C. for about one hour. The coated material is preferably cured at approximately 150° C.

At least one embodiment of the present invention provides the composition of a covercoat that can be used on the surface of any article where flame-resistance and electrical bias are desired. Although the illustrative embodiment of the covercoat is described with reference to flexible circuits for use in consumer electronics, it is understood that the covercoat may be adapted for use with materials or substances of any type.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following examples are on a weight basis, and all reagents used in the examples were obtained, or are available, from the chemical suppliers described below, or may be synthesized by conventional techniques.

Materials Used
  EXOLIT 930: a halogen-free organic phosphinate, available from Clariant Corporation, Charlotte N.C., TX.
  EXOLIT 1230: a halogen-free organic phosphinate, available from Clariant Corporation.
  AR7100 Solder Mask: a urethane solder mask, available from Ajinomoto Fine Technology Company, Incorporated, Kawasaki-Shi, Japan.

The following test methods were used to characterize the films produced in the examples:

Underwriters Laboratories UL94 V0 Flammability Resistance Test

This test is a measurement of the tendency of an article to either extinguish or to spread a flame once the article has been ignited. The articles are first coated with the covercoat and cut into one-half inch by five inch pieces. The articles are pre-conditioned at 50% humidity and 23° C. for at least 48 hours. A gas burner and flame are set up pursuant to American Standard Test Methods (ASTM) D5207-97. The articles are oriented and clamped in a vertical position and subjected to the flame for ten seconds. The flame is then withdrawn and the first burn time is recorded. After the burning ceases, the flame is applied for an additional ten seconds. The flame is again withdrawn and the second burn time is recorded. Additional data recorded include: the afterglow after the second application, whether the article burns to the clamp, and whether the articles drop flaming particles that ignite cotton positioned underneath the article.

Steady State Temperature Humidity Bias Life Test (JEDEC/EIA A101-B)

This test is a measurement of the electrical resistance of articles coated with the composition of the present invention.

concentrations, burn times, afterglow time, whether the article burned to a clamp, and whether the article ignited cotton, as analyzed pursuant to the methods discussed above, of Example 1-8.

TABLE 1

| Ex. | EXOLIT type, Wt % | Polymide thickness, mm | $1^{st}$ Burn time, sec | $2^{nd}$ Burn time, sec | Afterglow, sec | Burn to Clamp | Ignite Cotton | V0 Test |
|---|---|---|---|---|---|---|---|---|
| 1 | 15% EXOLIT 930 | 4 | 0 | 0 | 0 | No | No | Passed |
| 2 | 15% EXOLIT 1230 | 4 | 0 | 0 | 0 | No | No | Passed |
| 3 | 20% EXOLIT 930 | 2 | 2 | 0 | 0 | No | No | Passed |
| 4 | 20% EXOLIT 1230 | 2 | 0 | 0 | 0 | No | No | Passed |
| 5 | 20% EXOLIT 930 | 4 | 0 | 0 | 0 | No | No | Passed |
| 6 | 20% EXOLIT 1230 | 4 | 2 | 0 | 0 | No | No | Passed |
| 7 | 15% EXOLIT 930 | 2 | Consumed | N/A | 0 | Yes | No | Failed |
| 8 | 15% EXOLIT 1230 | 2 | Consumed | N/A | 0 | Yes | No | Failed |

Prior to applying the covercoat, the samples are cleaned in an ultrasonic cleaner for 30 seconds. The articles are then placed on lint-free tissue paper and dried with filtered, compressed air. After cleaning, the articles are coated with the composition of the covercoat to a film thickness of approximately 50 microns. The articles are then placed in an 85% humidity and 85° C. temperature environment. At this environment, a continuous 90 volts is applied to the articles and the current between the positive and negative biased regions of the articles are measured. Low electrical currents indicate high resistance values. Articles having resistance values around 1E+9 are considered to have very good resistance. If the current exceeds 0.01 milliamps, the voltage to that article is shut off and the article is considered to have failed the test.

Examples 1-8

Examples 1, 3, 5, and 7 are compositions of the present invention, with component concentrations (in weight percent) of EXOLIT 930 and AR7100 Solder Mask applied onto a polymide film, as provided in Table 1. Examples 2, 4, 6, and 8 are also compositions of the present invention, with component concentrations (in weight percent) of EXOLIT 1230 and AR7100 Solder Mask applied onto a polymide film, also provided in Table 1.

Example 1 was made using a mixing and coating process. A sample of the covercoat was prepared by adding the phosphinate into a urethane solder mask at a ratio of approximately 15% by solid weight of the solder mask. The mixture was subsequently well mixed. After mixing, the composition was applied to a polymide film to obtain a final film thickness of between approximately 20 microns and approximately 40 microns when dry. The coated material was then cured in an oven at approximately 150° C. for about one hour. Examples 2-8 were made using the same process as discussed for Example 1, except that the concentrations of EXOLIT 930 and EXOLIT 1230 were varied. The thickness of the polymide film as well as the final film thickness was also varied.

Articles coated with the compositions of Example 1-8 were tested for flammability. Table 1 provides the composition The data provided in Table 1 illustrates the flame-resistance exhibited by the addition of a phosphinate, such as EXOLIT 903 or EXOLIT 1230, to the coating composition of an article, as depicted by Examples 1-8. The articles of Examples 1-6 exhibited minimal to no burn time after being subjected to a flame for 10 seconds, as well as no afterglow. Additionally, the articles of Examples 1-6 did not burn to the clamp maintaining them in position during the flammability test, and did not drip flaming particles that ignited cotton placed under the articles.

The only difference between the articles of Examples 7 and 8, and the articles of Examples 1 and 2, respectively, was the thickness of the polymide film. The compositions of Examples 7 and 8 were coated onto a polymide film having a thickness of 2 millimeters. In contrast, the compositions of Examples 1 and 2 were coated onto a polymide film having a thickness of 4 millimeters. While the articles of Examples 1 and 2 both passed the V0 Flammability Test, the articles of Examples 7 and 8 were consumed after being subjected to a flame for 10 seconds. The Example 7 and 8 articles also burned to the clamp holding the articles. In contrast, the articles of Examples 1 and 2 did not burn after being exposed to a flame, exhibited no afterglow, did not burn to the clamp, and did not ignite cotton. The fact that the articles of Examples 7 and 8 burned after being exposed to a flame for 10 seconds can be attributed to the fact that thinner articles tend to burn more easily than thicker articles.

The only difference between the articles of Examples 7 and 8, and the articles of Examples 3 and 4, respectively, was the weight percent of phosphinate in the coating compositions. The articles of Examples 7 and 8 were coated with compositions that comprised 15% by weight phosphinate. In contrast, the articles of Examples 3 and 4 were coated with compositions that comprised 20% by weight phosphinate. As can be seen in Table 1, while the compositions of Examples 3 and 4 both passed the V0 Flammability Test, the compositions of Examples 7 and 8 did not. Thus, the addition of more phosphinate increased the flame-resistance of the coating compositions.

The articles of Examples 5 and 6 differed from the articles of Examples 7 and 8 in two respects. First, the compositions of Examples 5 and 6 were coated on thicker polyimide films and second, the compositions of Examples 5 and 6 also comprised a greater amount of phosphinate. As with the articles of Examples 1, 2, 3, and 4, the articles of Examples 5 and 6 also did not burn after being exposed to a flame for 10 seconds. The articles of Examples 5 and 6 also did not exhibit an afterglow, burn to the clamp, or ignite cotton positioned beneath the examples.

Examples 9-12

Examples 9 and 10 are compositions of the present invention, with component concentrations (in weight percent) of EXOLIT 930 and AR7100 Solder Mask applied onto a polymide film, as provided in Table 2. Examples 11 and 12 are also compositions of the present invention, with component concentrations (in weight percent) of EXOLIT 1230 and AR7100 Solder Mask applied onto a polymide film, also provided in Table 2.

Examples 9-12 were made using the same process as described above for Example 1.

Articles coated with the compositions of Examples 9-12 were tested for electrical bias. Table 2 provides the composition concentrations and resistance, as analyzed pursuant to the methods discussed above, of Example 9-12.

The covercoat composition of the present invention is flame-resistant and exhibits high electrical resistivity at high temperatures and high humidity without using any chemical halogens. The covercoat also may have a reduced thickness and is easily applied by conventional coating methods, making its application desirable in the field of consumer electronics, particularly for use with flexible circuits.

Although the present invention has been described with reference to preferred embodiments, workers skilled in the art will recognize that changes may be made in form and detail without departing from the spirit and scope of the invention.

The invention claimed is:

1. A flame-resistant electrical circuit covercoat composition comprising:
    a phosphinate component; and
    a urethane solder mask resin, wherein the phosphinate component comprises:
    a polyol mixture;
    polypropylene glycol;
    polyisocyanate; and
    phosphinate.

2. The composition of claim 1, wherein the phosphinate component comprises between about 10% and about 30% by weight of the composition.

TABLE 2

|  | Example 9 | Example 10 | Example 11 | Example 12 |
|---|---|---|---|---|
|  |  | EXOLIT type, wt % |  |  |
|  | 15% EXOLIT 930 | 20% EXOLIT 930 | 15% EXOLIT 1230 | 20% EXOLIT 1230 |
| Resistance after 112 hours, ohms | 1.69E+10 | 1.67E+10 | 6.57E+10 | 9.53E+9 |
| Resistance after 185 hours, ohms | 1.90E+10 | 1.56E+10 | 6.25E+10 | 9.42E+9 |
| Resistance after 255 hours, ohms | 4.62E+9 | 2.66E+10 | 1.88E+10 | 9.08E+9 |
| Resistance after 426 hours, ohms | 4.9E+9 | 3.20E+10 | 2.80E+10 | 2.08E+9 |
| Resistance after 525 hours, ohms | 6.35E+9 | 3.09E+10 | 1.98E+10 | 1.32E+9 |
| Resistance after 595 hours, ohms | 2.77E+9 | 3.66E+10 | 2.8E+10 | 1.71E+9 |
| Resistance after 693 hours, ohms | 1.27E+10 | 2.69E+10 | 1.44E+10 | 3.08E+9 |
| Resistance after 767 hours, ohms | 7.69E+9 | 3.53E+10 | 2.97E+10 | 2.09E+9 |
| Resistance after 863 hours, ohms | 1.30E+10 | 4.57E+10 | 3.20E+10 | 3.48E+9 |
| Resistance after 1014 hours, ohms | 9.51E+9 | 4.04E+10 | 2.28E+10 | 3.8E+9 |

The data provided in Table 2 illustrates the electrical bias, or non-conductivity, exhibited by articles coated with the compositions of the present invention. The articles coated with the compositions of Examples 9-12 exhibited good resistances after being subjected to the Steady State Temperature Humidity Bias Life Test. In particular, after 1014 hours, Example 9 had a resistance of 9.51E+9 ohms, Example 10 had a resistance of 4.04E+10 ohms, Example 11 had a resistance of 2.28E+10 ohms, and Example 12 had a resistance of 3.8E+9 ohms.

As can be seen in Table 2, articles coated with the compositions of Examples 9-12 comprising phosphinate exhibited electrical resistivity in a high temperature and high humidity environment.

3. The composition of claim 2, wherein the phosphinate component comprises between about 15% and about 25% by weight of the composition.

4. The composition of claim 1, wherein the phosphinate component is halogen-free.

5. The composition of claim 1, wherein the urethane solder mask comprises between about 70% and about 90% by weight of the composition.

6. A flexible circuit comprising:
    a substrate; and
    a flame-resistant covercoat comprising a mixture of a urethane solder mask resin and a phosphinate component, wherein the phosphinate component comprises:

a polyol mixture;

polypropylene glycol;

polyisocyanate; and phosphinate.

7. The circuit of claim 6, wherein the phosphinate component comprises between about 10% and about 30% by weight of the covercoat.

8. The circuit of claim 7, wherein the phosphinate component comprises between about 15% and about 25% by weight of the covercoat.

9. The circuit of claim 6, wherein the substrate is a polymide substrate.

10. The circuit of claim 6, wherein the covercoat has a thickness of between about 25 microns and about 30 microns.

* * * * *